(12) United States Patent
Martwick

(10) Patent No.: US 6,949,810 B2
(45) Date of Patent: Sep. 27, 2005

(54) ACTIVE PHASE CANCELLATION FOR POWER DELIVERY

(75) Inventor: Andrew W. Martwick, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 64 days.

(21) Appl. No.: 10/685,959

(22) Filed: Oct. 14, 2003

(65) Prior Publication Data

US 2005/0077622 A1 Apr. 14, 2005

(51) Int. Cl.[7] .......................... H01L 29/00; H01L 23/02
(52) U.S. Cl. ................ 257/531; 257/532; 257/678
(58) Field of Search ................ 257/531, 532, 257/533, 678, 729

(56) References Cited

U.S. PATENT DOCUMENTS

| 5,639,989 A | * | 6/1997 | Higgins, III | 174/35 MS |
| 6,525,609 B1 | * | 2/2003 | Behzad | 330/254 |
| 2003/0202331 A1 | * | 10/2003 | Jessie et al. | 361/764 |
| 2003/0222356 A1 | * | 12/2003 | Kinoshita | 257/781 |

* cited by examiner

*Primary Examiner*—Ngân V. Ngô
(74) *Attorney, Agent, or Firm*—Blakely, Sokoloff, Taylor and Zafman

(57) ABSTRACT

An apparatus and a method for active phase cancellation for an inductor/capacitor network have been disclosed. One embodiment of the apparatus includes a package and a die mounted on the package. The die comprises circuitry to to substantially cancel resonance between an inductance of the package and a capacitance of the die.

25 Claims, 8 Drawing Sheets

ACTIVE PHASE CANCELLATION FOR POWER DELIVERY

FIELD OF INVENTION

The present invention relates to semiconductor circuit design, and more particularly, to cancellation of the effect of an input signal into an inductor/capacitor network.

BACKGROUND

In a typical semiconductor device in a computer system, a die is mounted in a package, which is bonded through balls to a motherboard. The connection between the package and the die has a certain amount of inductance. On the die, there are also numerous transistors. The die is usually coupled to a power supply, such as, Vcc, which is fed back to the package, and then to the motherboard. Because of this, when one or more of the transistors are turned on, devices on the die draw current from the power supply. The net effect is modeled by the power grid shown in FIG. 1A. The inductor L1 represents the package inductance and the resistor $R_L$ represents the load on the die.

Referring to FIG. 1A, when there is a change in the current through the inductor L1, the inductance of the inductor prevents the current from going through the inductor L1. Therefore, the voltage across the inductor L1 drops in response to the increase in the current draw. As the voltage drops, the current through the inductor starts to increase. Eventually, the voltage at the node between the inductor and the load $R_L$ would drop to the ground. However, dropping the voltage to the ground would cause the voltages of the components in the die to drop to the ground as well. For example, there are flip-flops in the die using power to store data. If the voltages of the flip-flops drop to the ground, the data stored in the flip-flops would be lost. Furthermore, circuits that are switching when the voltage drops to the ground would switch incorrectly. To prevent the voltage from dropping to the ground, an on-die capacitor $C_{die}$ is added to the power grid as shown in FIG. 1B.

The on-die capacitor in FIG. 1B is initially charged to the voltage Vcc. When the switch is initially closed, the capacitor supplies current to the switched load $R_L$ while the current through the inductor is increasing. This causes a drop in the voltage of the capacitor, which is known as an undershoot. As the current through the inductor increases to supply the current to $R_L$, it also supplies current to the capacitor. Thus, the current starts to flow back into the drained capacitor to re-charge the capacitor. As the capacitor is being charged, the capacitor voltage rises, and subsequently, less and less current flows into the capacitor. The excess current from the inductor flows into the load $R_L$, and thus, causing a rise in voltage greater than Vcc. This phenomenon is commonly called an overshoot. The cycle of overshoot and undershoot is commonly referred to as the ringing or the resonance. An example of a signal having ringing is shown in FIG. 2.

Currently, the on-die capacitor is made by grounding the substrate of a device, such as, for example, a p-type metal oxide semiconductor transistor (pMOS), and tying the gate, the source, and the drain of the device to a power supply, such as, Vcc. Using current technology, the gate of the pMOS usually has a thickness of several molecules, and therefore, current leaks through the gate. Leakage results in increased power dissipation of the die. In addition to the problem of leakage current, the on-die capacitor also takes up a lot of area on the die, which increases the cost of the device.

One prior art technique to reduce the ringing is to reduce the inductance of the package. This allows the inductor to respond faster to changes in the load current. The inductance of the package is inversely proportional to the number of bonding balls on the package. However, the bonding balls are costly as well, and therefore, this solution is expensive.

Another prior art technique to reduce the ringing is to add a damping resistor $R_d$ as shown in FIG. 1B. However, the damping resistor $R_d$ fails to reduce the undershoot and only serves to help terminate the ringing by dissipating power.

BRIEF DESCRIPTION OF THE DRAWINGS

The present invention will be understood more fully from the detailed description that follows and from the accompanying drawings, which however, should not be taken to limit the appended claims to the specific embodiments shown, but are for explanation and understanding only.

DETAILED DESCRIPTION

In the following description, numerous specific details are set forth. However, it is understood that embodiments of the invention may be practiced without these specific details. In other instances, well-known circuits, structures, and techniques have not been shown in detail in order not to obscure the understanding of this description.

Figure 1A:
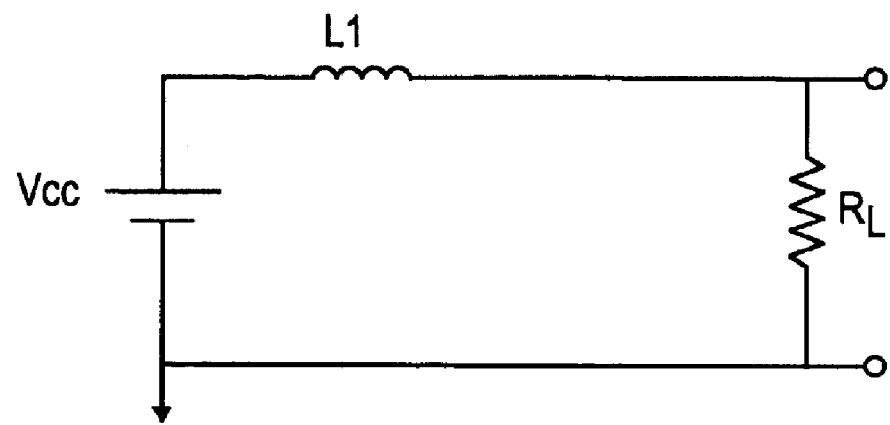
FIG. 1A shows a power grid modeling the effect of package inductance.
Figure 1B:
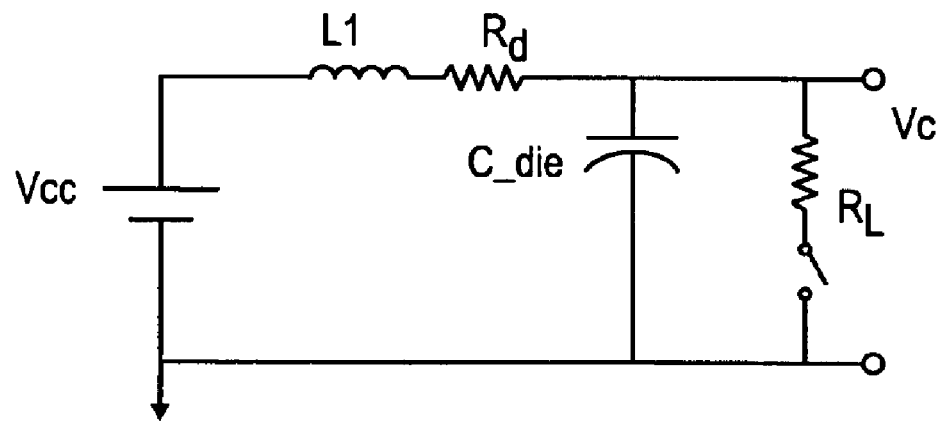
FIG. 1B shows a power grid modeling the effect of package inductance interacting with an on-die capacitor and a damping resistor.
Figure 2:
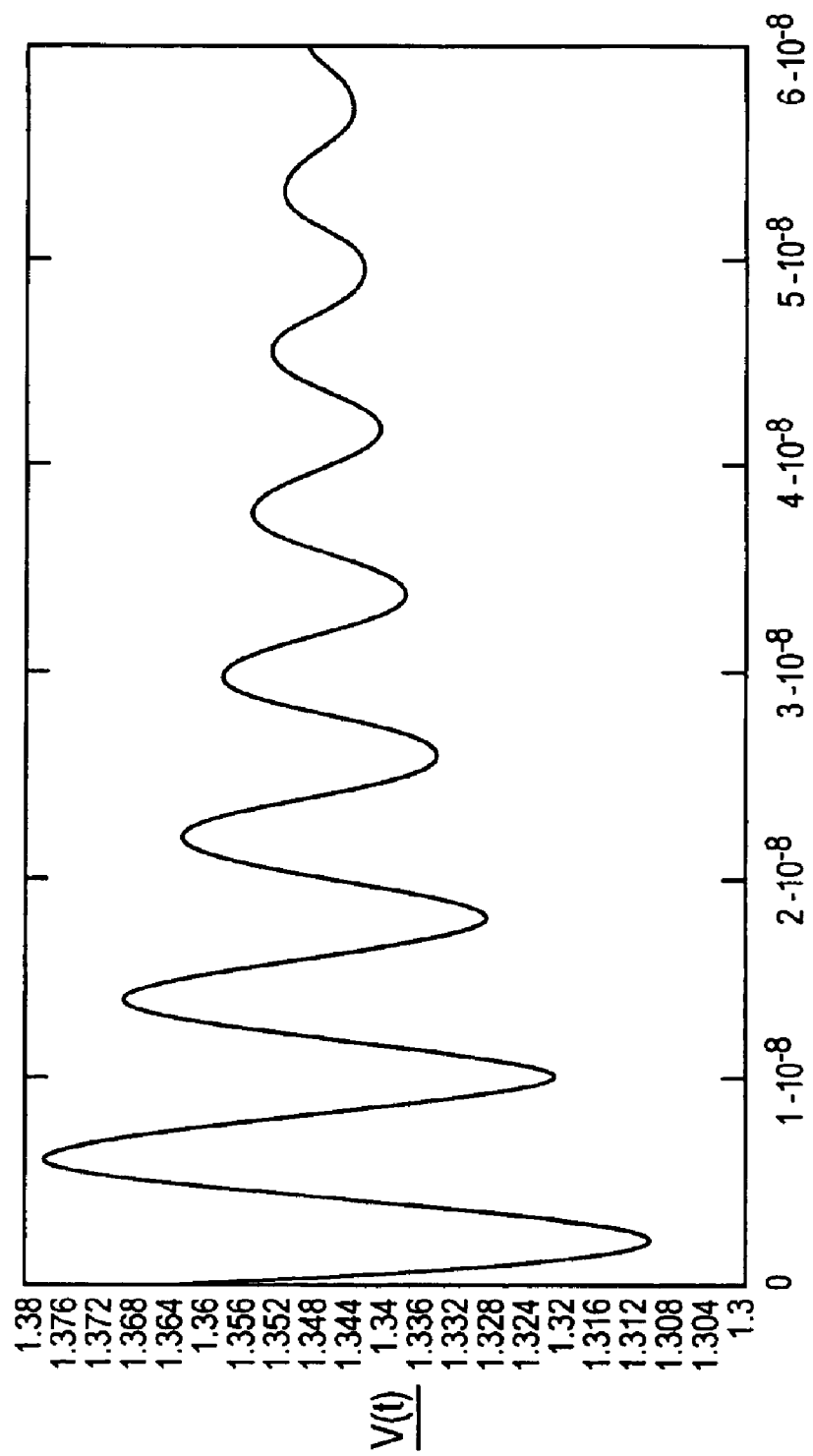
FIG. 2 shows an example of a signal during ringing.
Figure 3A:
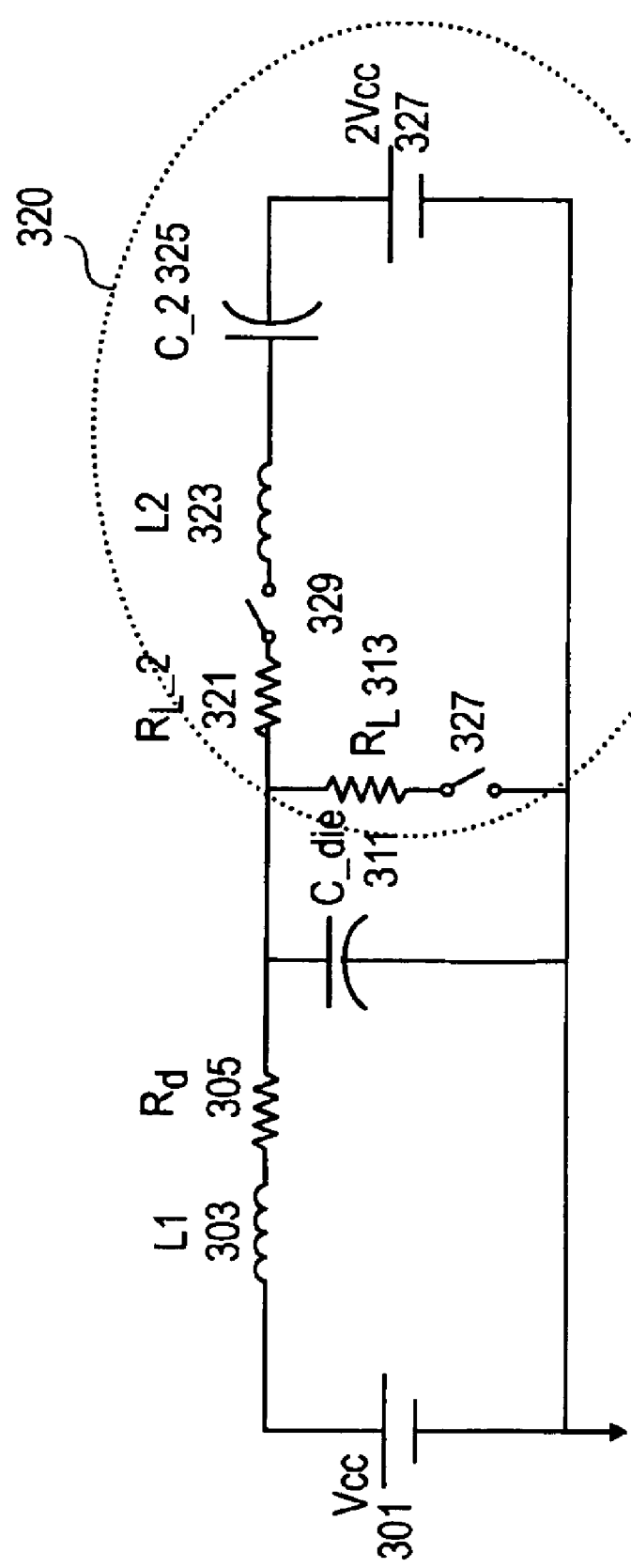
FIG. 3A shows one embodiment of an active phase cancellation circuit.

FIG. 3A shows one embodiment of an active phase cancellation circuit 300. The components on the left side of the circuit model the power grid of a semiconductor die in a package, including the power supply 301, the inductor 303, and the damping resistor 305. Referring to FIG. 3A, the circuit further includes an on-die capacitor $C_{die}$ 311, a load resistor $R_L$ 313, a second load resistor $R_{L\_2}$ 321, an inductor $L_2$ 323, a second capacitor $C_2$ 325, and an on-die power source 327. The active phase cancellation circuit in FIG. 3A further includes two switches 327 and 329. In one embodiment, the on-die power source is twice of Vcc. In an alternate embodiment, the power source is substantially equal to Vcc. The power source may provide different amounts of power in other embodiments. However, the larger the power source is, the more power is dissipated.

In one embodiment, the capacitor 325, the load resistor 321, and the inductor 323 form an inductive-resistive-capacitive circuit (RLC circuit) 320 substantially similar to the equivalent circuit modeling the power grid of the die and the package. Therefore, closing the switches 327 and 329 causes ringing in the current flowing through the circuit 320, where the ringing is similar to the ringing in the package but 180 degrees out of phase. In one embodiment, the switches 327 and 329 are closed substantially simultaneously in response to the core logic or some other current source (not shown) of the die. The RLC circuit 320 generates a current similar to a mirror image of the ringing current in the package power grid. The current from the circuit 320 substantially cancels the ringing current caused by the package inductance, and therefore, it is unnecessary to increase the on-die capacitance or to reduce the package inductance in order to reduce the peak-to-peak ringing current.

Figure 3B:
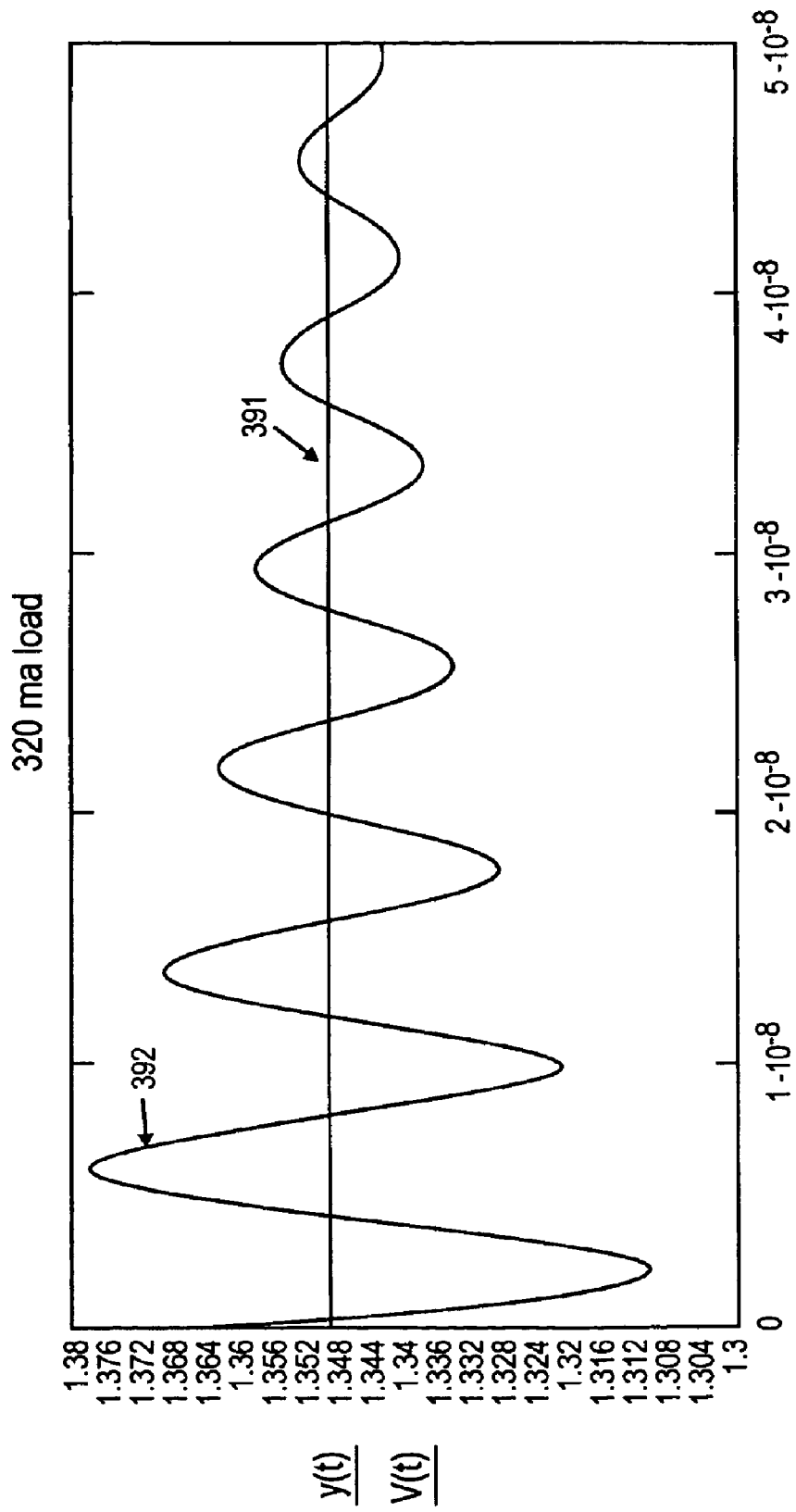
FIG. 3B shows an example of ringing current caused by package inductance.

FIG. 3B shows an example of a signal 391 from an exemplary device with one embodiment of the active phase cancellation circuit turned on and a signal 392 from the exemplary device with one embodiment of the active phase cancellation turned off.

Figure 4:
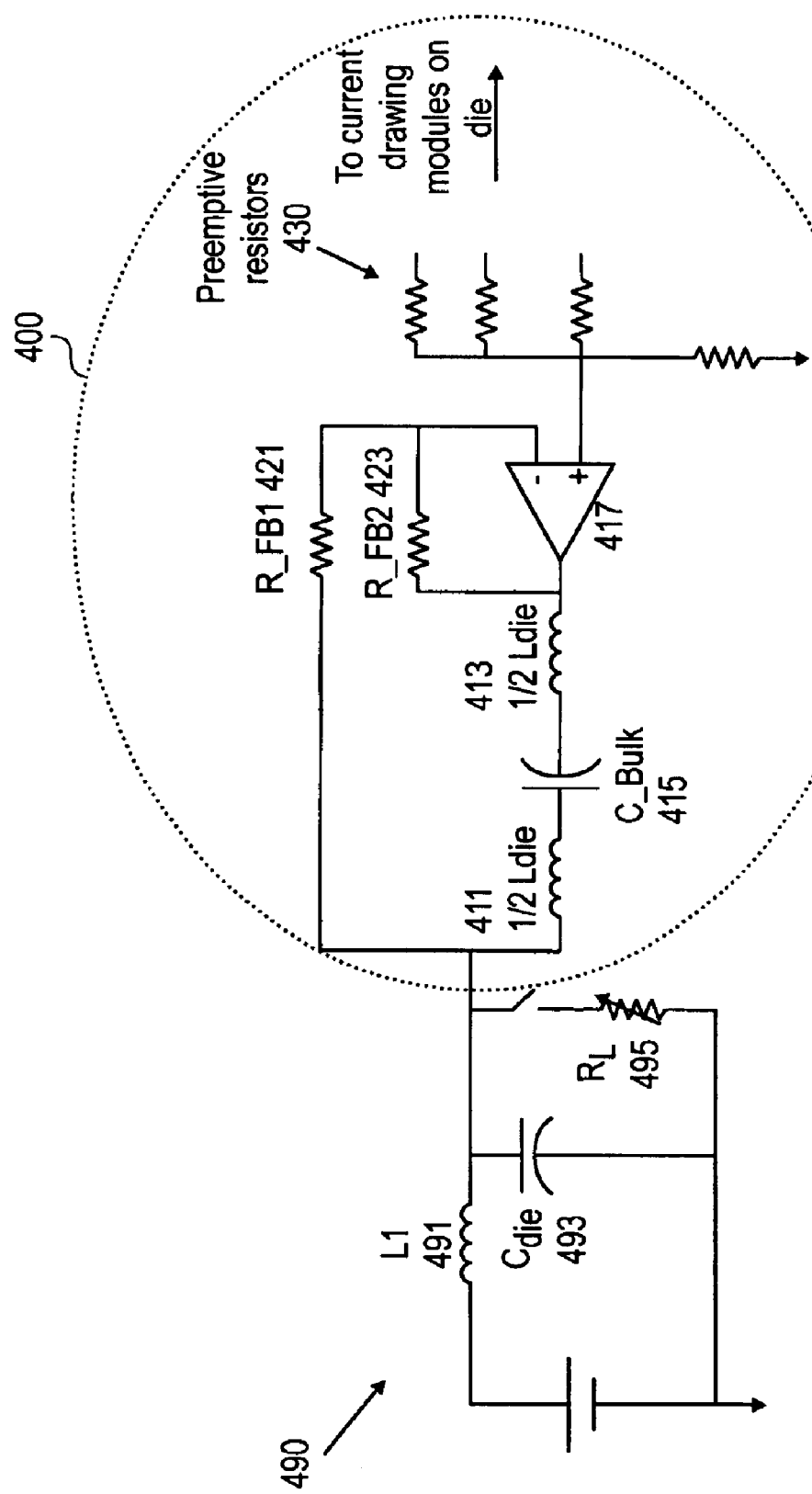
FIG. 4 shows one embodiment of an active phase cancellation circuit.

FIG. 4 shows an alternate embodiment of an active phase cancellation circuit. The circuit 400 in FIG. 4 includes a bulk capacitor 415, two inductors 411 and 413, an amplifier 417, two feedback resistors 421 and 423, and a number of preemptive resistors 430. Coupled to the left of the circuit 400 is a model of the power grid 490 of a semiconductor die in a package. The power grid 490 includes an inductor L1 491 representing the package inductance, a capacitor $C_{die}$ 493 representing the die capacitance, and a resistor $R_L$ 493 representing the load resistance. In one embodiment, the capacitance of the bulk capacitor 415 is 300 pF and the capacitance of $C_{die}$ 493 is 30 nF. However, one should appreciate that these capacitance values are provided herein merely as examples. Other embodiments include capacitors of different values.

In one embodiment, the preemptive resistors 430 coupled a number of current-drawing modules (not shown) in the core logic of the die to a first input of the amplifier 417. The output of the amplifier 417 drives the inductors 411 and 413 and the bulk capacitor 415. The inductors 411 and 413 and the bulk capacitor 415 are coupled to each other in series. The feedback resistors 421 and 423 couple a second input of the amplifier 417 to each end of the series of the inductors 411 and 413 and the bulk capacitor 415. A feedback of the voltage across the inductors 411 and 413 and the bulk capacitor 416 may be provided to the amplifier 417 via the feedback resistors 421 and 423. In one embodiment, the bulk capacitor 415 is initially charged to store resonance energy. When ringing occurs in the power grid 490, the amplifier 417 drives the resonance energy out of the bulk capacitor 415 onto the power grid 490 to generate a signal to substantially cancel the ringing signal in the power grid 490.

In one embodiment, the amplifier 417 is capable of driving the transient current of the load resistor $R_L$ 495. The transient current may go up to 1A in an exemplary chipset device. In one embodiment, the bulk capacitor 415 is off-die, and the other components are on-die. In an alternate embodiment, the bulk capacitor 415 is on-die with other components of the circuit 400. Using off-die capacitor reduces the cost of the die because of the saving in the silicon area of the die.

In one embodiment, the equivalent inductance of the inductors 411 and 413 substantially matches the package inductance L1 491 in the power grid 490. In one embodiment, the inductors 411 and 413 have substantially the same inductance. In an alternate embodiment, a single inductor, instead of two inductors, is coupled to the bulk capacitor 415.

Figure 5:
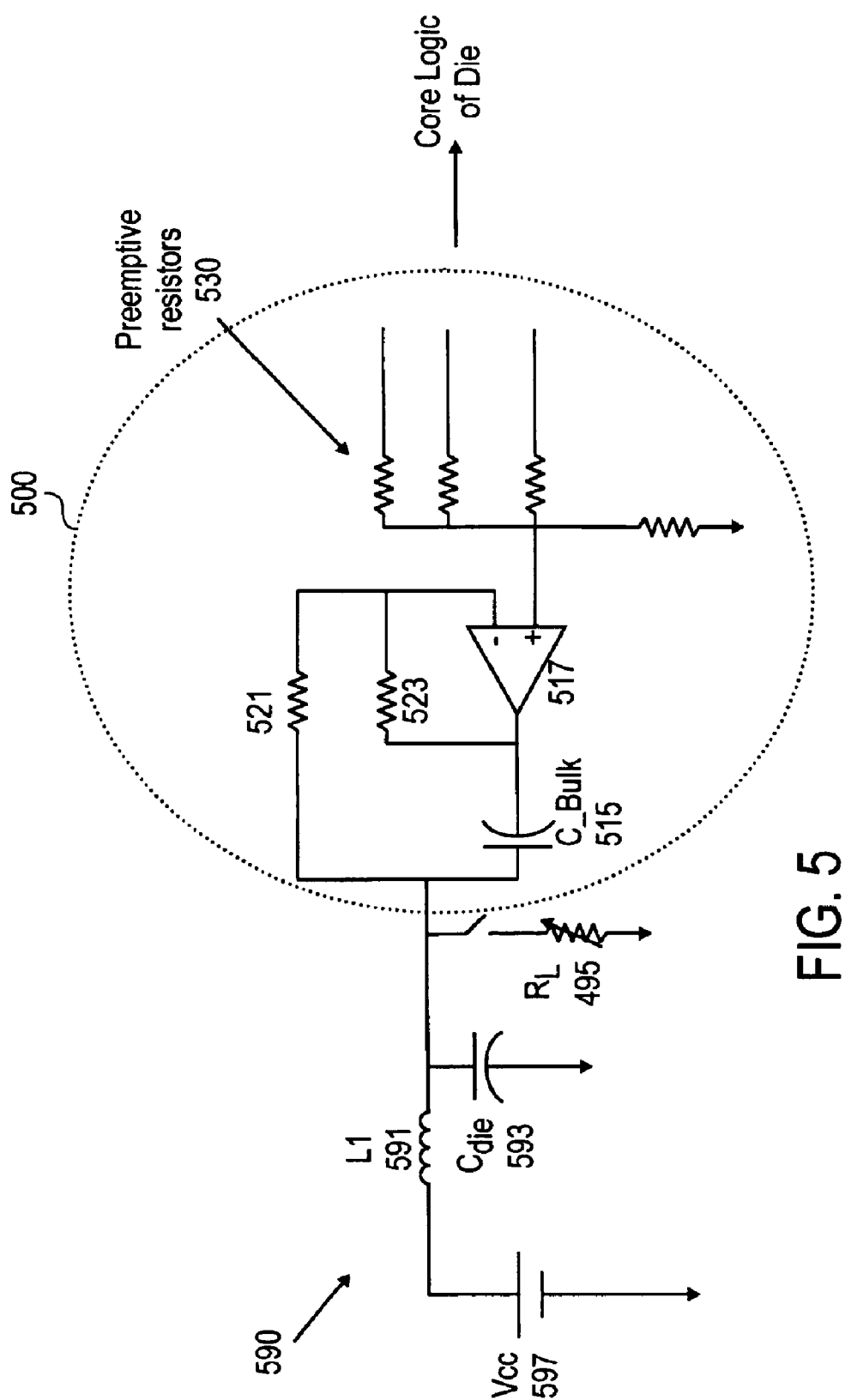
FIG. 5 shows another embodiment of an active phase cancellation circuit.

FIG. 5 shows an alternate embodiment of an active phase cancellation circuit in an exemplary device. Referring to FIG. 5, the active phase cancellation circuit 500 includes a number of preemptive resistors 530, an amplifier 517, a bulk capacitor C_bulk 515, and two feedback resistors 521 and 523. A circuit 590 modeling the power grid of the die in the package is coupled to the active phase cancellation circuit 500. The power grid 590 includes a power source Vcc 597, an inductor L1 591 representing the package inductance, a capacitor $C_{die}$ 593 representing the on-die capacitance, and a resistor 595 representing the load of the die.

In one embodiment, the preemptive resistors 530 coupled a number of current drawing modules in the core logic (not shown) of the die to the positive input terminal of the amplifier 517. In one embodiment, the output terminal of the amplifier 517 is coupled to the base of the bulk capacitor 515. The other end of the bulk capacitor 515 is coupled to the circuit 590. In one embodiment, each end of the bulk capacitor 515 is also coupled via one of the two feedback resistors 521 and 523 to the negative input terminal of the amplifier 517 to provide a feedback to the amplifier.

In one embodiment, the step response of $R_L$ 595 is canceled by the derivative response of an impulse function through the bulk capacitor 515. This impulse response of opposite polarity is driven onto the circuit 590 at the same time as the step response of $R_L$ 595. The derivative response then serves to cancel the change in voltage across the inductor, since the derivative of the step response is a delta function. It can be shown that any input into the network, such as the step response represented by the closing of the switch, can be canceled by driving the derivative of the input signal through the bulk capacitor 515, such as the delta function, which is a derivative of the step response.

Figure 6:
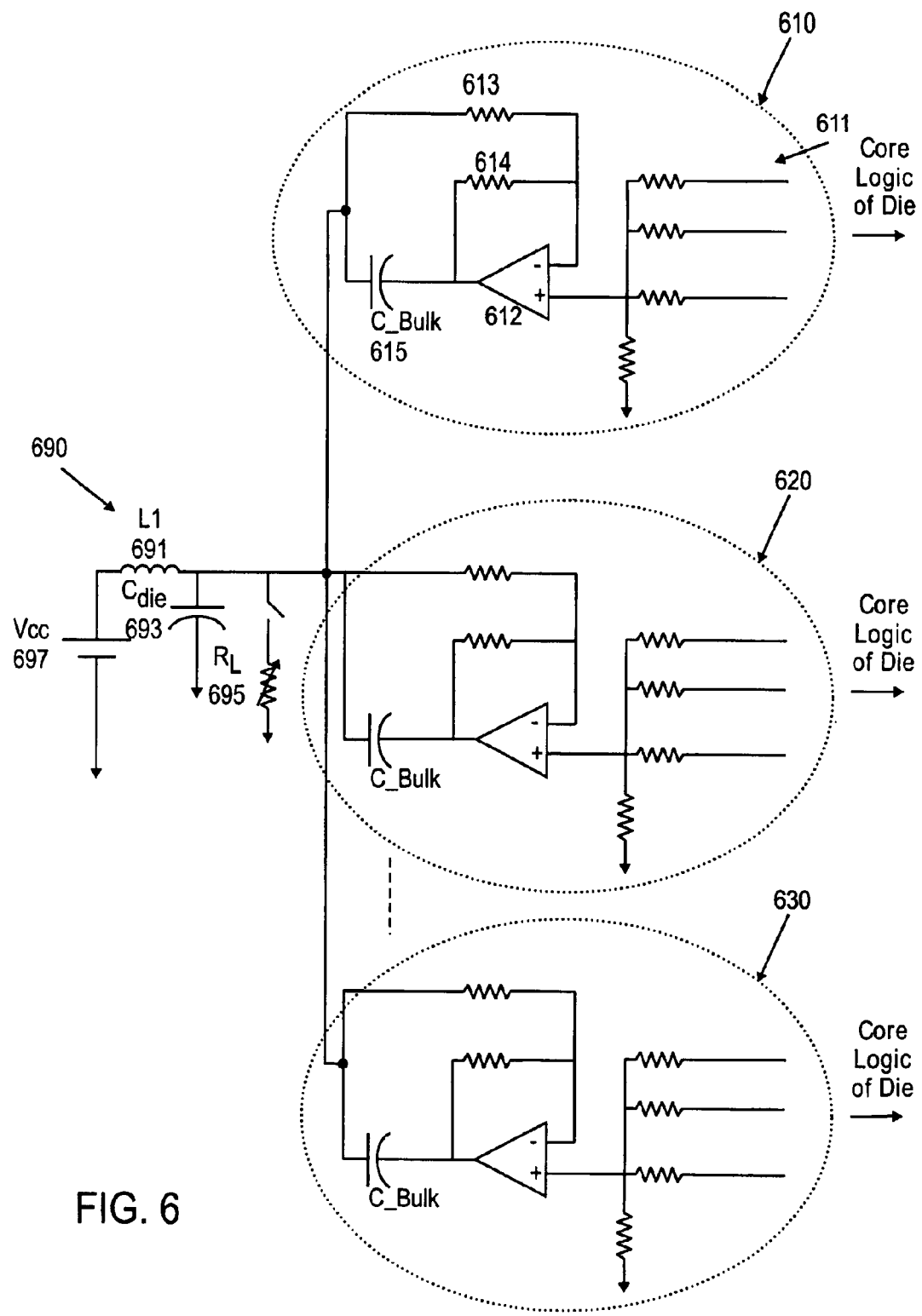
FIG. 6 shows still another embodiment of an active phase cancellation circuit.

FIG. 6 shows an alternate embodiment of an active phase cancellation circuit. The circuit in FIG. 6 includes a number of modules 610–630, each being substantially similar to the active phase cancellation circuit 500 shown in FIG. 5. For example, the module 610 includes a number of preemptive resistors 611, an amplifier 612, two feedback resistors 613 and 614, and a bulk capacitor 615. In one embodiment, there are 3 modules in the active phase cancellation circuit. In other embodiments, there are different numbers of modules, such as, for example, 2, 5, etc.

Referring to FIG. 6, the bulk capacitance used to generate a current to substantially cancel the ringing current caused by package inductance is broken down and distributed into a number of smaller capacitors, one in each of the modules 610–630, such as, for example, the bulk capacitor 615 in module 610. In one embodiment, an amplifier in each module drives the corresponding bulk capacitor. For example, the amplifier 612 in module 610 drives the bulk capacitor 615. In one embodiment, the amplifier 612 in the module 610 has a gain smaller than the gain of the amplifier 517 shown in FIG. 5 because the bulk capacitor 615 in the module 610 is smaller than the bulk capacitor 515 in FIG. 5. Likewise, each of the amplifiers in the modules 620 and 630 has a smaller gain than the amplifier 517 in FIG. 5. In one embodiment, the amplifiers in the modules 610–630 have substantially the same gain.

Figure 7:
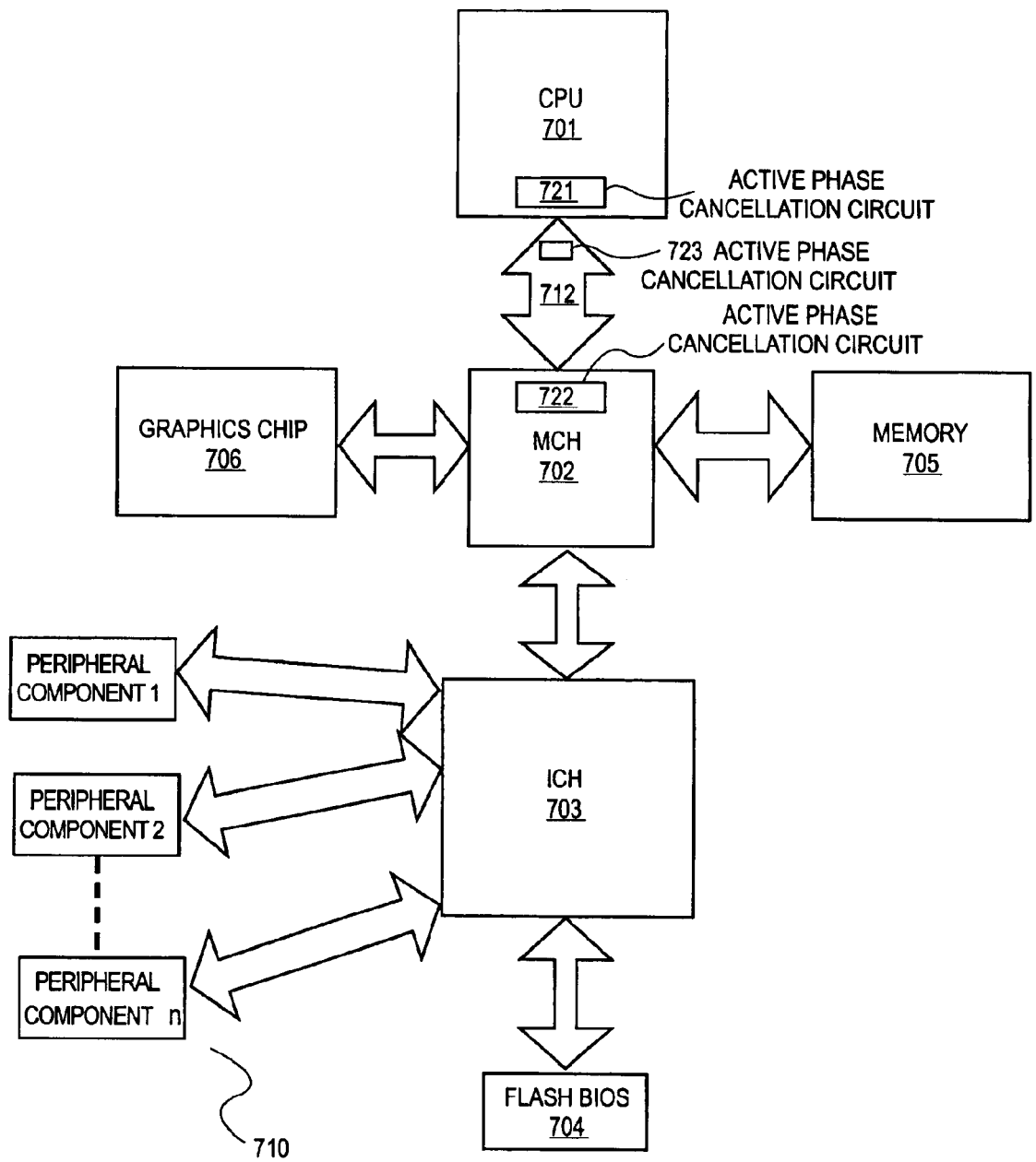
FIG. 7 shows an exemplary embodiment of a computer system.

FIG. 7 is a block diagram of an exemplary embodiment of a computer system. The system 700 includes a central processing unit (CPU) 701, a memory controller (MCH) 702, an input/output controller (ICH) 703, a flash memory device storing the Basic Input Output System (Flash BIOS) 704, a memory device 705, a graphics chip 706, and a number of peripheral components 710. The CPU 701 is coupled to the MCH 702 via a front side bus (FSB) 712. The CPU 701 includes a microprocessor, but is not limited to a microprocessor, such as, for example, Pentium® processor, Itanium® processor, PowerPC®, etc. The memory device 705, the graphics chip 706, and the ICH 703 are coupled to the MCH 702. The memory device 705 may include a dynamic random access memory (DRAM), a Rambus® dynamic random access memory (RDRAM), or a synchronous dynamic random access memory (SDRAM).

In one embodiment, data sent and received between the CPU 701, the memory device 705, the graphics chip 706, and the ICH 703 are routed through the MCH 702. The peripheral components 710 and the flash BIOS 704 are coupled to the ICH 703. The peripheral components 710 and the flash BIOS 704 communicate with the CPU 701, the graphics chip 706, and the memory 705 through the ICH 703 and the MCH 702. Note that any or all of the components of system 700 and associated hardware may be used in various embodiments of the present invention. However, it can be appreciated that other configurations of the computer system may include some or all of the devices.

Due to the package inductance of various packaged semiconductor devices in the computer system 700, there is ringing of signals in the devices and the buses coupling the devices, such as, for example, the MCH 702, the CPU 701, the FSB 712, etc. Ringing may also be referred to as resonance.

To reduce ringing, one or more of the devices in the system 700 may incorporate an active phase cancellation circuit to reduce ringing by generating a signal to substantially cancel the ringing signal caused by the package inductance. In one embodiment, the FSB 712 includes an active phase cancellation circuit 723. In one embodiment, the CPU 701 includes an active phase cancellation circuit 721 to reduce ringing. The active phase cancellation circuit 721 may be integrated into the input/output (I/O) of the CPU 721. In one embodiment, the MCH 702 includes an active phase cancellation circuit 722 to reduce ringing as well.

In one embodiment, the active phase cancellation circuit includes a capacitor, an inductor, and a resistor coupled in series to an on-die power source to generate a current to substantially cancel the ringing signal caused by the package inductance. In an alternate embodiment, the active phase cancellation circuit includes an amplifier, a number of preemptive resistors, and a bulk capacitor. The preemptive resistors couple a number of current drawing modules in the core logic of the die to the amplifier so that the amplifier can drive the bulk capacitor to generate a current to substantially cancel the current caused by ringing.

The foregoing discussion merely describes some exemplary embodiments of the present invention. One skilled in the art will readily recognize from such discussion, the accompanying drawings and the claims that various modifications can be made without departing from the spirit and scope of the appended claims. The description is thus to be regarded as illustrative instead of limiting.

What is claimed is:

1. A semiconductor device comprising:
   a package; and
   a die mounted in the package, the die comprising first circuitry to substantially cancel resonance between an inductance of the package and a capacitance of the die.

2. The semiconductor device of claim 1, wherein the first circuitry comprises:
   a current source;
   an inductor coupled to the current source in series; and
   a power supply operable with the current source and the inductor to substantially cancel the resonance.

3. The semiconductor device of claim 2, wherein the current source comprises a resistor.

4. The semiconductor device of claim 2, wherein the current source comprises a transistor.

5. The semiconductor device of claim 2, wherein an inductance of the inductor is substantially equal to the inductance of the package.

6. The semiconductor device of claim 1, wherein the first circuitry comprises:
   a bulk; capacitor; and
   second circuitry coupled to the bulk capacitor to drive the bulk capacitor to substantially cancel the resonance.

7. The semiconductor device of claim 6, wherein the second circuitry comprises an amplifier.

8. The semiconductor device of claim 7, further comprising a plurality of preemptive resistors coopted to a first input of the amplifier and for coupling a plurality of current drawing modules in the die to the amplifier to drive the amplifier.

9. The semiconductor device of claim 8, further comprising one or more feedback resistors to couple the bulk capacitor to a second input of the amplifier.

10. The semiconductor device of claim 9, wherein the first circuitry further comprises one or more inductors coupled to the capacitor.

11. The semiconductor device of claim 10, wherein an equivalent inductance of the one or more inductors is substantially equal to the inductance of the package.

12. The semiconductor device of claim 1, further comprising an off-die capacitor, wherein the first circuitry is operable with the off-die capacitor to substantially cancel the resonance.

13. A system comprising:
   a dynamic random access memory (DRAM); and
   a memory controller coupled to the DRAM, wherein the memory controller comprises
      a package, and
      a die mounted in the package, wherein the die comprises first circuitry to substantially cancel resonance between an inductance of the package and a capacitance of the die.

14. The system of claim 13, wherein the first circuitry comprises:
   a current source;
   an inductor coupled to the current source in series; and
   a power supply operable with the current source and the inductor to substantially cancel the resonance.

15. The system of claim 14, wherein the current source comprises a resistor.

16. The system of claim 14, wherein the current source comprises a transistor.

17. The system of claim 14, wherein an inductance of the inductor is substantially equal to the inductance of the package.

18. The system of claim 13, wherein the first circuitry comprises:
   a bulk capacitor; and
   second circuitry coupled to the hulk capacitor to drive the bulk capacitor to substantially cancel the resonance.

19. The system or claim 18, wherein the second circuitry comprises an amplifier.

20. The system of claim 19, wherein the memory controller further comprises a plurality of preemptive resistors coupled to a first input of the amplifier and for coupling a plurality of current drawing modules in the memory controller to the amplifier to drive die amplifier.

21. The system of claim 20, wherein the memory controller further comprises one or more feedback resistors to couple the bulk capacitor to a second input of the amplifier.

22. The system of claim 21, wherein the memory controller further comprises one or more inductors coupled to the capacitor.

23. The system of claim 22, wherein an equivalent inductance of the one or more inductors is substantially equal to the inductance of the package.

24. The system of claim 13, further comprises an off-die capacitor operable with the first circuitry to substantially cancel the resonance.

25. The system of claim 13, further comprising a processor coupled to the memory controller.

* * * * *